(12) United States Patent
Higashi et al.

(10) Patent No.: US 11,778,747 B2
(45) Date of Patent: Oct. 3, 2023

(54) WIRING BOARD, COMPOSITE SUBSTRATE, AND ELECTRIC DEVICE

(71) Applicant: KYOCERA Corporation, Kyoto (JP)

(72) Inventors: Toshifumi Higashi, Kirishima (JP); Youji Furukubo, Kirishima (JP); Takafumi Yamaguchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 387 days.

(21) Appl. No.: 17/291,214

(22) PCT Filed: Nov. 7, 2019

(86) PCT No.: PCT/JP2019/043616
§ 371 (c)(1),
(2) Date: May 4, 2021

(87) PCT Pub. No.: WO2020/095980
PCT Pub. Date: May 14, 2020

(65) Prior Publication Data
US 2021/0410286 A1    Dec. 30, 2021

(30) Foreign Application Priority Data
Nov. 8, 2018   (JP) ................................. 2018-210660

(51) Int. Cl.
*H05K 1/18*     (2006.01)
*H05K 1/02*     (2006.01)
*H05K 1/11*     (2006.01)

(52) U.S. Cl.
CPC .......... *H05K 1/181* (2013.01); *H05K 1/0209* (2013.01); *H05K 1/112* (2013.01); *H05K 2201/09427* (2013.01); *H05K 2201/2018* (2013.01)

(58) Field of Classification Search
CPC ...................................................... H05K 1/181
(Continued)

(56) References Cited

U.S. PATENT DOCUMENTS 4,433,886 A * 2/1984 Cassarly ............... H01L 23/552
                                                            439/699.1
5,291,375 A    3/1994 Mukai
(Continued)

FOREIGN PATENT DOCUMENTS

EP    1873131 A1    1/2008
EP    1898495 A1    12/2008
(Continued)

*Primary Examiner* — Stanley Tso
(74) *Attorney, Agent, or Firm* — Volpe Koenig

(57) ABSTRACT

A wiring board includes: a base material including, on one side of the base material, a protruding part that protrudes toward an outside, wherein the protruding part has a shape in which a center portion of a principal surface rises from the outer periphery, and a plurality of external connection terminals is arranged on the principal surface. A composite substrate includes: the above-mentioned wiring board and a metallic frame member, wherein the frame member includes an opening whose shape is corresponding to a shape in a plan view of the protruding part, and the frame member is arranged such that the opening surrounds the protruding part to fill a periphery of the protruding part. An electric device includes: an electric element on a right face of the wiring board.

10 Claims, 14 Drawing Sheets

(58) Field of Classification Search
USPC .......................................................... 361/760
See application file for complete search history.

(56) References Cited

U.S. PATENT DOCUMENTS

| | | | | |
|---|---|---|---|---|
| 6,346,383 | B1* | 2/2002 | Kajiyama | B01J 19/0046 |
| | | | | 435/6.12 |
| 2009/0090452 | A1 | 4/2009 | Naba et al. | |
| 2009/0091897 | A1* | 4/2009 | Willing | H02M 7/003 |
| | | | | 361/752 |
| 2014/0340107 | A1* | 11/2014 | Sun | G01R 1/0483 |
| | | | | 324/756.02 |
| 2016/0112219 | A1* | 4/2016 | Lee | H04W 4/80 |
| | | | | 455/77 |
| 2018/0019435 | A1* | 1/2018 | Katagiri | H05K 7/20963 |
| 2018/0084660 | A1* | 3/2018 | Meguro | H05K 5/0013 |

FOREIGN PATENT DOCUMENTS

| | | | |
|---|---|---|---|
| JP | 10-209642 | A | 8/1998 |
| JP | 2005032787 | * | 7/2003 |
| JP | 2005-032787 | A | 2/2005 |
| JP | 2007-042848 | A | 2/2007 |
| JP | 2009-139758 | A | 6/2009 |
| JP | 2009-147010 | A | 7/2009 |
| JP | 2009-281962 | A | 12/2009 |
| JP | 2012-182382 | A | 9/2012 |

* cited by examiner

WIRING BOARD, COMPOSITE SUBSTRATE, AND ELECTRIC DEVICE

FIELD

The present disclosure relates to a wiring board, a composite substrate, and an electric device.

BACKGROUND

Conventionally, a wiring board made of organic resins or ceramics is broadly employed in order to mount thereon a functional component, such as a semiconductor element and a light emitting element, or a passive component such as a capacitor (see Patent Literatures 1 and 2, for example).

CITATION LIST

Patent Literature

Patent Literature 1: Japanese Patent Application Laid-open No. 2005-032787
Patent Literature 2: Japanese Patent Application Laid-open No. 2012-182382

SUMMARY

Solution to Problem

A wiring board according to one aspect of embodiments includes: a base material including, on one side of the base material, a protruding part that protrudes toward an outside, wherein the protruding part has a shape in which a center portion of a principal surface rises from an outer periphery, and a plurality of external connection terminals is arranged on the principal surface.

A composite substrate according to one aspect of the embodiments includes: the above-mentioned wiring board; and a metallic frame member, wherein in a plan view of the base material, the frame member includes an opening whose shape is corresponding to a shape of the protruding part, and the frame member is arranged such that the opening surrounds the protruding part to fill a periphery of the protruding part.

An electric device according to one aspect of the embodiments includes: an electric element on a right face of the above-mentioned wiring board.

DESCRIPTION OF EMBODIMENTS

Figure 1:
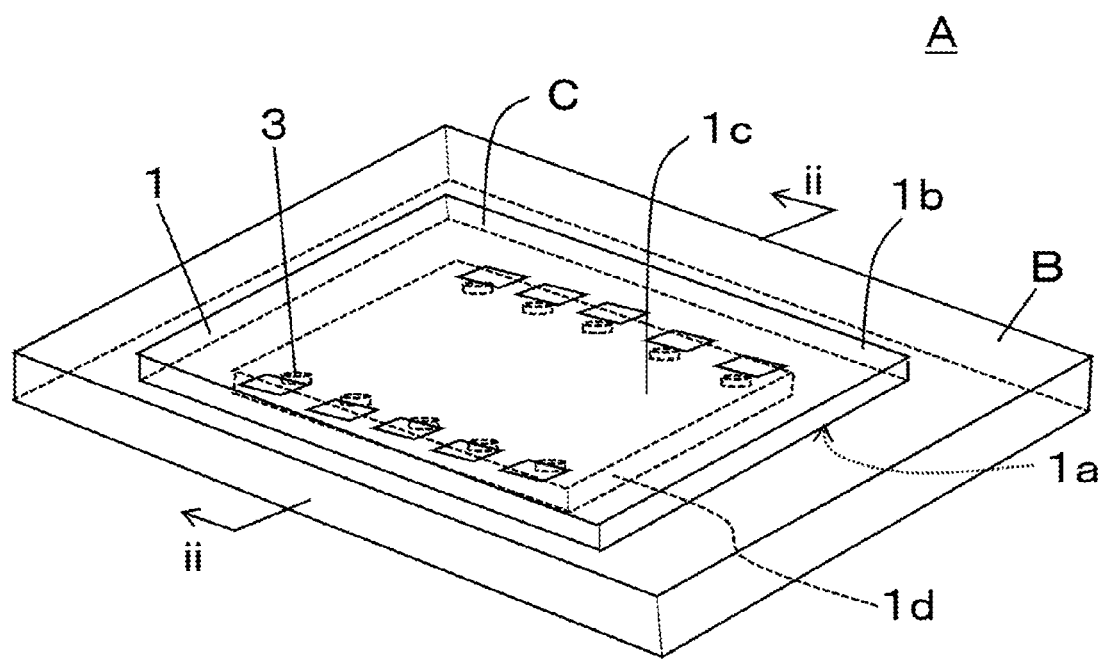
FIG. 1 is a perspective view illustrating one mode of a mounting structure according to embodiments of the present disclosure.
Figure 2:
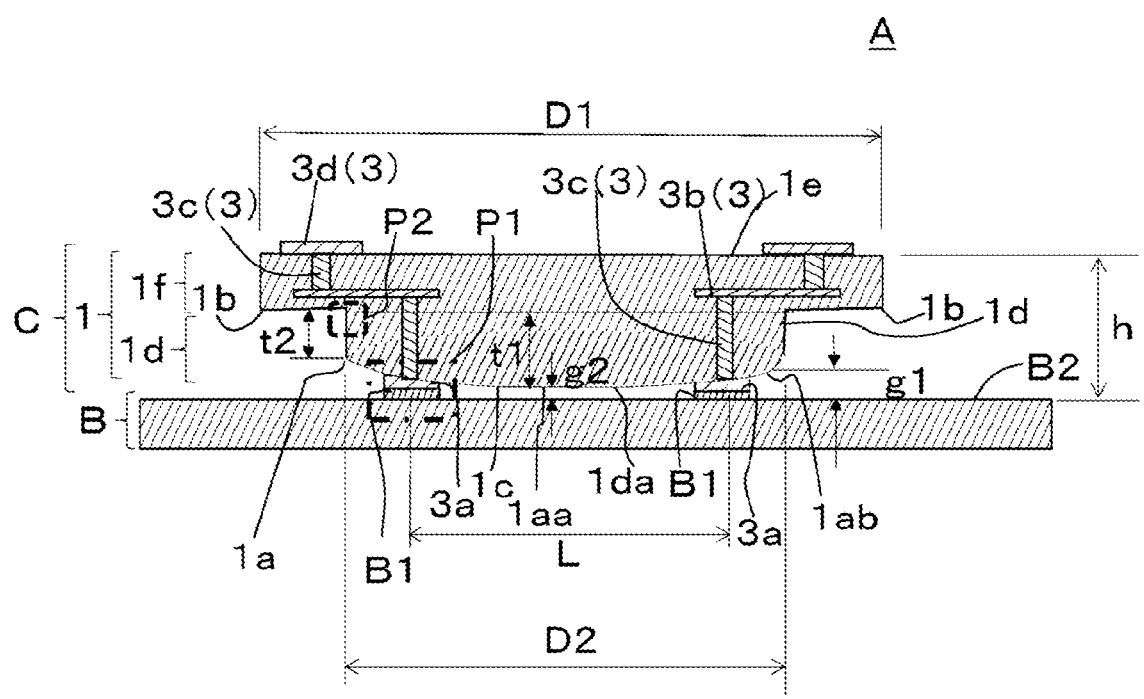
FIG. 2 is a cross-sectional view taken along a line ii-ii illustrated in FIG. 1.
Figure 3:
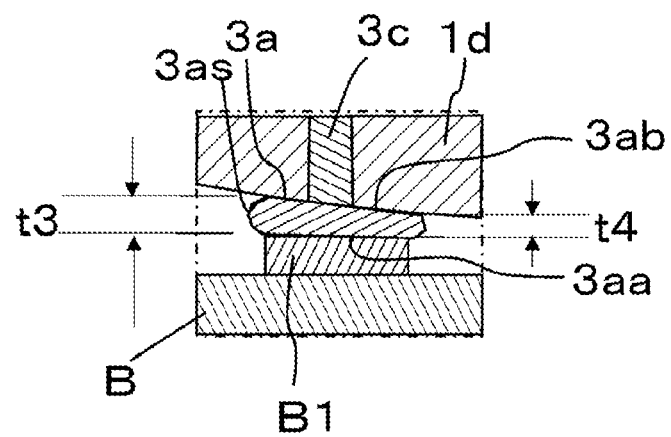
FIG. 3 is an enlarged view illustrating a part P1 illustrated in FIG. 2.
Figure 4:
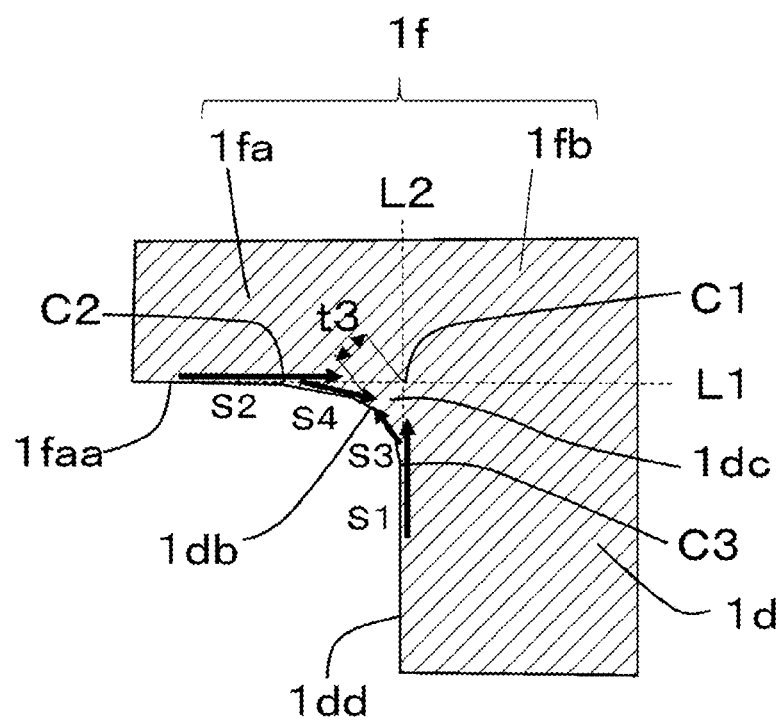
FIG. 4 is an enlarged view illustrating a part P2 illustrated in FIG. 2.

Embodiments described below are for providing a wiring board, a composite substrate, and an electric device capable of reducing a mounting area and improving heat dissipation. Herein, as illustrated in FIGS. 1 and 2, for convenience of explanation, a mounting structure is exemplified in which a wiring board is mounted on an external circuit board. FIG. 1 is a perspective view illustrating one mode of a mounting structure according to embodiments of the present disclosure. FIG. 2 is a cross-sectional view taken along a line ii-ii illustrated in FIG. 1. FIG. 3 is an enlarged view illustrating a part P1 illustrated in FIG. 2. FIG. 4 is an enlarged view illustrating a part P2 illustrated in FIG. 2.

A mounting structure A according to the embodiments includes a wiring board C on a surface of an external circuit board B. The wiring board C includes a base material 1 and electric conductors 3. The base material 1 includes, on its one side, a protruding part 1d that protrudes toward the outside. Herein, "on one side" means a side of a reverse face 1*a* on which the protruding part 1*d* is arranged. In FIG. 2, the protruding part 1*d* is a part that protrudes toward the external circuit board B. A principal surface of the protruding part 1*d* may be referred to as a first surface 1*da*. A surface of the base material 1 on an opposite side to the reverse face 1*a* is defined as a right face 1*e*. In the base material 1, a portion other than the protruding part 1*d* is defined as a base 1*f*. The protruding part 1*d* may be arranged at an arbitrary position on the base 1*f*; however, the protruding part 1*d* may be preferably arranged at the center of the base 1*f*. In other words, it is preferable that in a plan view, a center position of the protruding part 1*d* and a center position of the base if are same to each other. On the first surface 1*da* of the protruding part 1*d*, as the electric conductors 3, external connection terminals 3*a* are arranged in an outer periphery 1*b*. The external connection terminals 3*a* perform electric connection to the external circuit board B. The external circuit board B includes a plurality of connecting pads B1. The outer periphery 1*b* is, in a plan view of the protruding part 1*d*, a region outer from a center 1*aa* by ½ of a length from the center 1*aa* of the protruding part 1*d* up to a side surface 1*dd* of the protruding part 1*d*.

The plurality of external connection terminals 3*a* arranged on the first surface 1*da* of the protruding part 1*d* and the plurality of connecting pads B1 arranged in the external circuit board B are electrically connected via not-illustrated bonding materials. An outside diameter D2 of the protruding part 1*d* is smaller than an outside diameter D1 of the base material 1. In the wiring board C, the external connection terminals 3*a* are arranged on the first surface 1*da* of the protruding part 1*d* whose outside diameter is smaller than that of the base material 1. A distance L between the external connection terminals 3*a* in the wiring board C is smaller compared with a case where the external connection terminals 3*a* are arranged on the right face 1*e* of the base material 1.

A size of the base material 1 constituting the wiring board C changes due to thermal expansion and the like. In the wiring board C, a deformation amount between the external connection terminals 3*a* is small even when a size of the wiring board C has changed due to thermal expansion. Thus, it is possible to improve connection reliability between the external connection terminals 3*a* arranged in the protruding part 1*d* and the connecting pads B1 arranged in the external circuit board B.

As illustrated in FIG. 2, the first surface 1*da* of the protruding part 1*d*, which is a principal surface, has a convexly protruding shape. In other words, the protruding part 1*d* has a shape in which a center portion of its principal surface rises from a periphery 1*ab* on an outer periphery side. In other words, the first surface 1*da* has a shape in which the center 1*aa*, which is an inside 1*c*, rises from the periphery 1*ab* on an outer periphery side. In other words, in the protruding part 1*d*, a thickness t1 in the center 1*aa* is larger than a thickness t2 in the periphery 1*ab*. As illustrated in FIG. 2, an interval between a position in the periphery 1*ab* on the first surface 1*da* of the protruding part 1*d* and a surface B2 of the external circuit board B is defined as "g1". An interval between a position in the center 1*aa* on the first surface 1*da* of the protruding part 1*d* and the surface B2 of the external circuit board B is defined as "g2". In the wiring board C, g2 is larger than g1. In other words, in the protruding part 1*d*, an interval between a position of the center 1*aa* and the surface B2 of the external circuit board B is smaller than an interval between a position of the periphery 1*ab* and the surface B2 of the external circuit board B. In other words, in the first surface 1*da* of the protruding part 1*d*, a position of the center 1*aa* is closer to the surface B2 of the external circuit board B than a position of the periphery 1*ab*. Thus, heat more easily moves from the center 1*aa* of the protruding part 1*d* to the surface B2 of the external circuit board B. In this case, it is preferable that the first surface 1*da* of the protruding part 1*d* is formed in curve-shaped protruding toward the surface B2 of the external circuit board B.

A ceramic having a high electric insulation such as alumina, cordierite, and aluminum nitride may be employed for a material to be employed for the base material 1. As a material to be employed for the electric conductors 3, copper, tungsten, molybdenum, or an alloy or an intermetallic compound containing at least two kinds of metals from among them may be preferably employed, because simultaneous firing with the above-mentioned ceramic is enabled. An organic laminated wiring board such as FR-4 may be employed for the external circuit board B.

As illustrated in FIG. 2, the wiring board C may include, as the electric conductors 3, inner wires 3*b*, via electric conductors 3*c*, and element connection terminals 3*d* in addition to the external connection terminals 3*a*. In FIG. 1, illustration of the inner wires 3*b* is omitted.

When focusing on each of the element connection terminals 3*d* and the external connection terminals 3*a*, it is preferable that an area of the external connection terminal 3*a* that is one of the electric conductors 3 constituting the wiring board C is smaller than an area of the element connection terminal 3*d* that is arranged on a side of the right face 1*e* of the base material 1. When an area of the external connection terminal 3*a* that is arranged on the first surface 1*da* on a side of the reverse face 1*a* of the base material 1 is smaller than an area of each of the element connection terminals 3*d* arranged on a side of the right face 1*e*, a pitch between the external connection terminals 3*a* is able to be reduced. Thus, the more external connection terminals 3*a* are able to be arranged on the first surface 1*da* of the protruding part 1*d* whose area is smaller than that on a side of the right face 1*e*. Furthermore, it is possible to improve heat dissipation from the external connection terminals 3*a* by the many external connection terminals 3*a* that are arranged on the first surface 1*da*. On the other hand, when an area of each of the element connection terminals 3*d* is large, function of the element connection terminals 3*d* itself as radiator improves. Accordingly, heat generated from an electric element mounted on the element connection terminals 3*d* easily dissipates so as to improve heat dissipation of the wiring board C.

Next, a shape of the external connection terminal 3*a* arranged on the first surface 1*da* of the protruding part 1*d* will be explained. The wiring board C includes the plurality of external connection terminals 3*a* on the first surface 1*da* of the protruding part 1*d*. The external connection terminals 3*a* are arranged on the first surface 1*da* that is a principal surface of the protruding part 1*d*. In a state where the external connection terminals 3*a* are arranged on the first surface 1*da* of the protruding part 1*d*, side surfaces 3*as* of the external connection terminals 3*a* are in an exposed state. The side surfaces 3*as* of the external connection terminals 3*a* are substantially perpendicular to the first surface 1*da* of the protruding part 1*d*. In a case of a state where the side surfaces 3*as* of the external connection terminals 3*a* are exposed, there present exposed parts in the external connection terminals 3*a*, thereby leading to improving heat dissipation from the external connection terminals 3*a*. In this case, the side surfaces 3*as* of the external connection terminals 3*a* may be convexly or concavely curved. When the side surfaces 3*as* of the external connection terminals 3*a* are in a convexly or concavely curved state, an area of side surfaces of the external connection terminals 3*a* is large compared with a case where the side surfaces 3*as* of the external connection terminals 3*a* are flat-shaped. An area of the side surfaces 3*as* of the external connection terminals 3*a* is large, thereby leading to further improving heat dissipation of the wiring board C.

As illustrated in FIG. 3, in the external connection terminal 3*a*, a thickness t3 on a side of the outer periphery 1*b* of the base material 1 is larger than a thickness t4 of the inside 1*c*. It is preferable that each of the plurality of external connection terminals 3*a* arranged on the first surface 1*da* of the protruding part 1*d* has a shape in which the thickness t3 on a side of the outer periphery 1*b* of the base material 1 is larger than the thickness t4 of the inside 1*c*. It is preferable that a connection surface 3*ab* with the via electric conductor 3*c* of the external connection terminal 3*a* has a shape along the first surface 1*da* of the protruding part 1*d*. It is preferable that a bonding surface 3*aa* with the connecting pad B1 of the external connection terminal 3*a* is substantially parallel to the surface B2 of the external circuit board B or a reverse face 1*e* of the base material 1. It is preferable that the bonding surface 3*aa* between the external connection terminal 3*a* and the connecting pad B1 is substantially parallel to the surface B2 of the external circuit board B or the reverse face 1*e* of the base material 1. When the bonding surface 3*aa* between the external connection terminal 3*a* and the connecting pad B1 is parallel to the surface B2 of the external circuit board B or the reverse face 1*e* of the base material 1, it is possible to equalize a height h from the surface B2 of the external circuit board B to the reverse face 1*e* of the base material 1 even when the first surface 1*da* of the protruding part 1*d* protrudes toward the outer side. When a functional element to be mounted on the reverse face 1*e* is a light emitting element such as a LASER element, it is possible to stabilize a direction of light emitted from the light emitting element.

As illustrated in FIG. 2, the wiring board C includes, as the electric conductors 3, the inner wires 3*b*, the via electric conductors 3*c*, and the element connection terminals 3*d* in addition to the external connection terminals 3*a*. In the base material 1, the external connection terminals 3*a*, the inner wires 3*b*, the via electric conductors 3*c*, and the element connection terminals 3*d* penetrate from the first surface 1*da* of the protruding part 1*d* to the right face 1*e* to be exposed from both of the surfaces. Thus, transfer of heat generated on a side of the element connection terminals 3*d* to a side of the external connection terminals 3*a* via the electric conductors 3 becomes easy.

Next, a foot shape of the protruding part 1*d* in the base material 1 will be explained. A portion of the base material 1 other than the protruding part 1*d* is defined as the base 1*f*. In the base 1*f*, a portion outer than the protruding part 1*d* is defined as a base periphery portion 1*fa*. In the base 1*f*, a portion overlapped with the protruding part 1*d* is defined as a base center portion 1*fb*. A portion from a surface 1*faa* of the base periphery portion 1*fa* to the side surface 1*dd* of the protruding part 1*d* is defined as a deep-eaves surface 1*db*. The deep-eaves surface 1*db* is concavely curved.

Next, as illustrated in FIG. 4, there are set a straight line L1 along the surface 1*faa* of the base periphery portion 1*fa* and a straight line L2 along the side surface 1*dd* of the protruding part 1*d*. In the base material 1, an intersection point between the straight line L1 and the straight line L2 is defined as C1. C2 is defined as a point at which the deep-eaves surface 1*db* separates from the straight line L1 that is drawn along the surface 1*faa* of the base periphery portion 1*fa*. C3 is defined as a point at which the deep-eaves surface 1*db* separates from the straight line L2 that is drawn along the side surface 1*dd* of the protruding part 1*d*. A region obtained by connecting the intersection point C1, the point C2, and the point C3 in the base material 1 is defined as a deep-eaves portion 1*dc*. In the wiring board C, the deep-eaves surface 1*db* has a concavely curved shape, and thus in the base material 1, the deep-eaves portion 1*dc*, which is extending from the surface 1*faa* of the base periphery portion 1*fa* to the side surface 1*dd* of the protruding part 1*d*, is thick. A thickness of the deep-eaves portion 1*dc* is the largest at the thickness t3 in a normal direction with respect to the deep-eaves surface 1*db* from the intersection point C1 and about midway between the point C2 and the point C3. In the base material 1 illustrated in FIG. 4, a corner portion connected with the base periphery portion 1*fa* and the protruding part 1*d* does not have a right-angular shape. Thus, a bending moment with respect to the base if of the protruding part 1*d* constituting the base material 1 of the wiring board C is higher compared with a case where a corner portion connected with the base periphery portion 1*fa* and the protruding part 1*d* has a right angle. Moreover, when the deep-eaves portion 1*dc* located in a corner portion connected with the base periphery portion 1*fa* and the protruding part 1*d* is concavely curved and further is thick, stress generated in the deep-eaves portion 1*dc* is able to be dispersed.

In FIG. 4, stress is indicated by using arrows S1, S2, S3, and S4. When a corner portion connected with the base periphery portion 1*fa* and the protruding part 1*d* has a right angle, the stress S1 in a direction along the side surface 1*dd* of the protruding part 1*d* and the stress S2 in a direction along the surface 1*faa* of the base periphery portion 1*fa* direct toward the intersection point C1. In such a case, the stress S1 and the stress S2 concentrate at the intersection point C1. On the other hand, when the deep-eaves portion 1*dc* formed at a corner portion connected with the base periphery portion 1*fa* and the protruding part 1*d* is concavely curved and further is thick, stresses divided from the stress S1 and the stress S2 are generated.

In FIG. 4, stress transmitted along the deep-eaves surface 1*db* from the base periphery portion 1*fa* is indicated by using the arrow S3. Stress transmitted along the deep-eaves surface 1*db* from the protruding part 1*d* is indicated by using the arrow S4. Assume a situation where the mounting structure A is exposed to an environment in which temperature is changed by heating up and cooling down. A size of the protruding part 1*d* of the wiring board C is changed due to a thermal expansion of the external circuit board B. The stresses S1 and S2 concentrating toward the deep-eaves portion 1*dc* from the base periphery portion 1*fa* go into a divided state into the stresses S1, S2, S3, and S4 due to difference in a thermal expansion coefficient between the base material 1 constituting the wiring board C and the external circuit board B. Hence, stress generated in the deep-eaves portion 1*dc* connected with the protruding part 1*d* and the base if is able to be dispersed. Thus, it is possible to improve connection reliability at a bonding part between the external circuit board B and the wiring board C.

Figure 5:
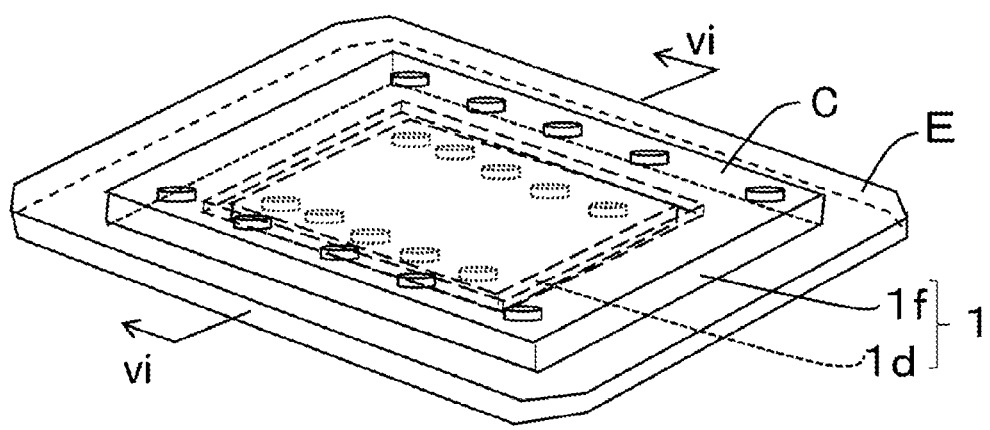
FIG. 5 is a perspective view illustrating one mode of a composite substrate according to the embodiments of the present disclosure.
Figure 6:
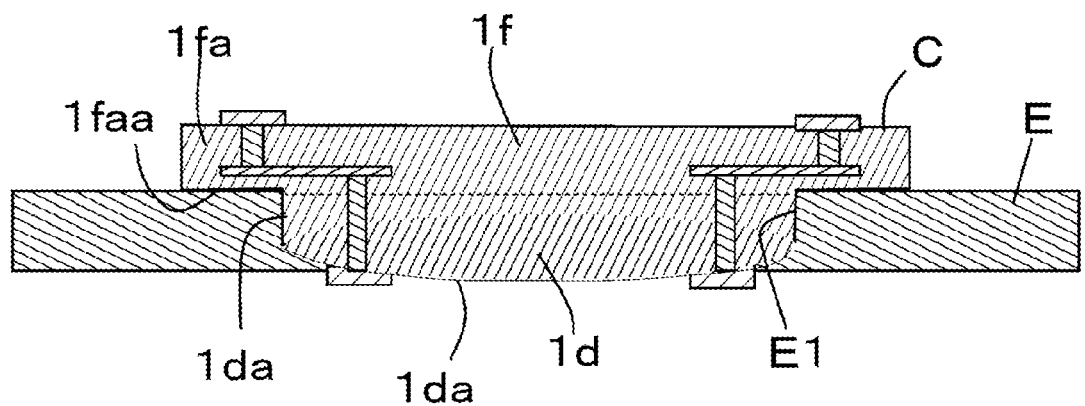
FIG. 6 is a cross-sectional view taken along a line vi-vi illustrated in FIG. 5.

FIG. 5 is a perspective view illustrating one mode of a composite substrate according to the embodiments of the present disclosure. FIG. 6 is a cross-sectional view taken along a line vi-vi illustrated in FIG. 5. A composite substrate D includes the wiring board C and a frame member E. The composite substrate D has a structure in which the frame member E is bonded to the wiring board C. In a plan view of the base material 1, the frame member E includes an opening E1 whose shape is corresponding to that of the protruding part 1d. The frame member E is arranged such that the opening E1 surrounds the protruding part 1d so as to fill a periphery of the protruding part 1d. The composite substrate D is in a state where the frame member E partially covers a first surface da of the protruding part 1d of the base material 1. Thus, heat is easily transmitted from the wiring board C to the frame member E, thereby leading to improving heat dissipation of the composite substrate D. An inner wall of the opening E1 is arranged to be opposite to the side surface 1dd of the protruding part 1d. An outer portion of the opening E1 of the frame member E is arranged to be in contact with the surface 1faa of the base periphery portion 1fa. In this case, it is preferable that a surface of the frame member E and the first surface 1da of the protruding part 1d are flush with each other. Herein, "being flush with" means that a height difference between a surface of the frame member E and the top of the first surface 1da of the protruding part 1d is equal to or less than 10 μm. When a gap between a surface of the frame member E and the first surface 1da of the protruding part 1d is in a flush-with state within the above-mentioned range, it is possible to mount the composite substrate D, which is obtained by combining the wiring board C and the frame member E, on a mother board with a high parallelism. When a light emitting element is mounted on the wiring board C, an optical axis is able to be stabilized. Particularly, when the plurality of openings E1 is provided in the frame member E and the wiring board C is arranged to each of the openings E1, optical axes of a plurality of light emitting elements are able to be more aligned in the same direction. The frame member E and the base material 1 may be fitted by using difference in a thermal expansion coefficient, a bonding material such as solder and silver solder may be applied, as needed basis, so as to bond them to each other.

The frame member E is preferably made of metal. When the frame member E is made of metal, it is possible to further improve heat dissipation from the wiring board C. As a material of the frame member E, copper or aluminum is preferably employed, because it has a high heat conductivity.

When the frame member E is attached to the metallic wiring board C, the frame member E has an electric conductivity higher than that of the base material 1 constituting the wiring board C, so that it is possible to apply thereto electric welding such as projection welding. A processing time interval of projection welding is shorter than that of common electric welding, so that it is possible to reduce probability of failure in the wiring board C and an electric element mounted thereon.

Figure 7:
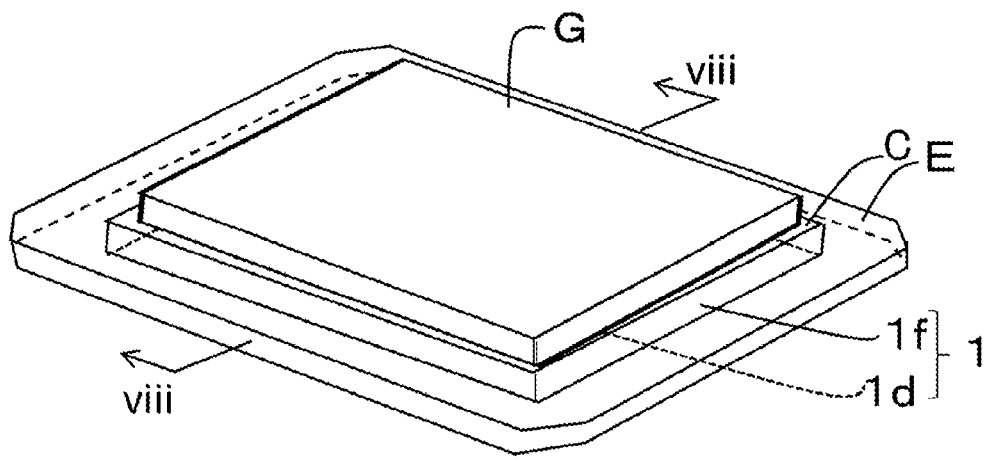
FIG. 7 is a perspective view illustrating one mode of an electric device according to the embodiments of the present disclosure.
Figure 8:
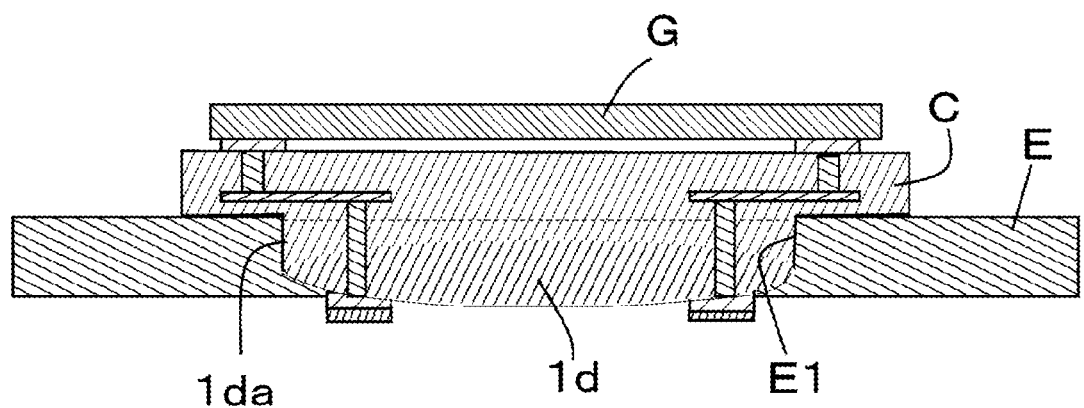
FIG. 8 is a cross-sectional view taken along a line viii-viii illustrated in FIG. 7.
Figure 9:
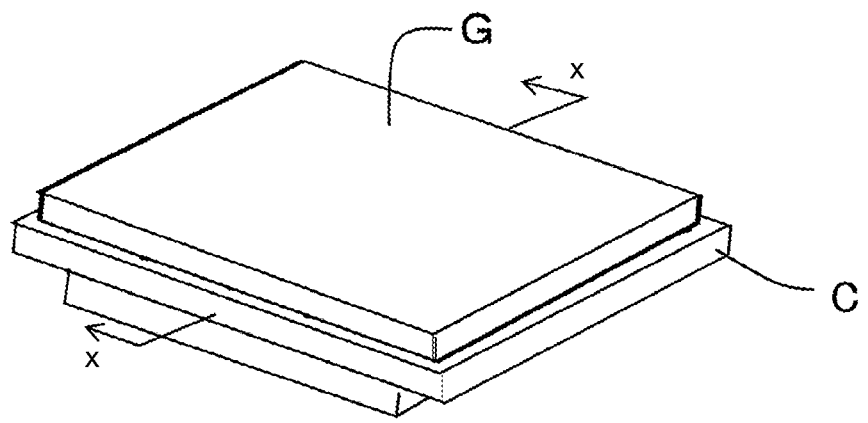
FIG. 9 is a perspective view illustrating another mode of the electric device according to the embodiments of the present disclosure.
Figure 10:
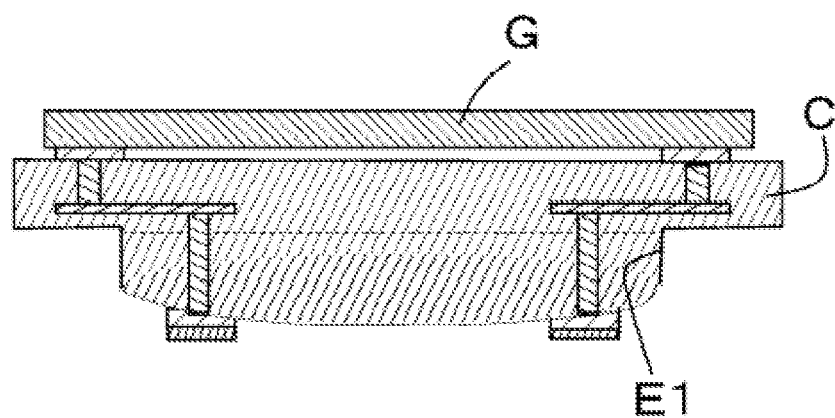
FIG. 10 is a cross-sectional view taken along a line x-x illustrated in FIG. 9.
Figure 11:
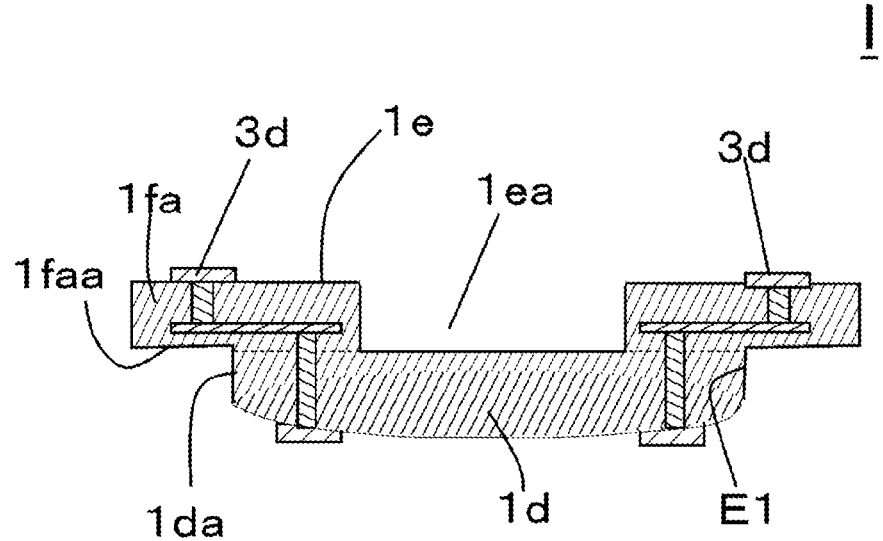
FIG. 11 is a cross-sectional view illustrating another mode of a wiring board according to the embodiments.
Figure 12:
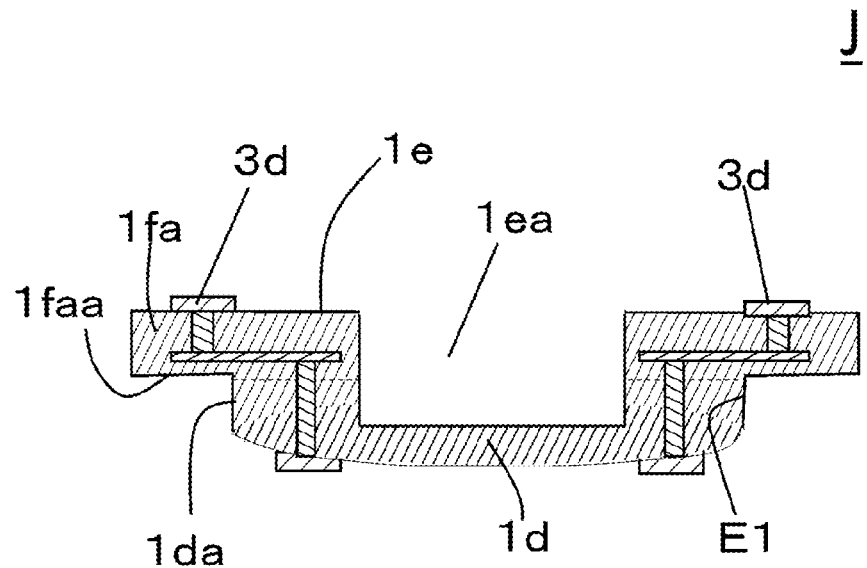
FIG. 12 is a cross-sectional view illustrating another mode of the wiring board according to the embodiments.
Figure 13:
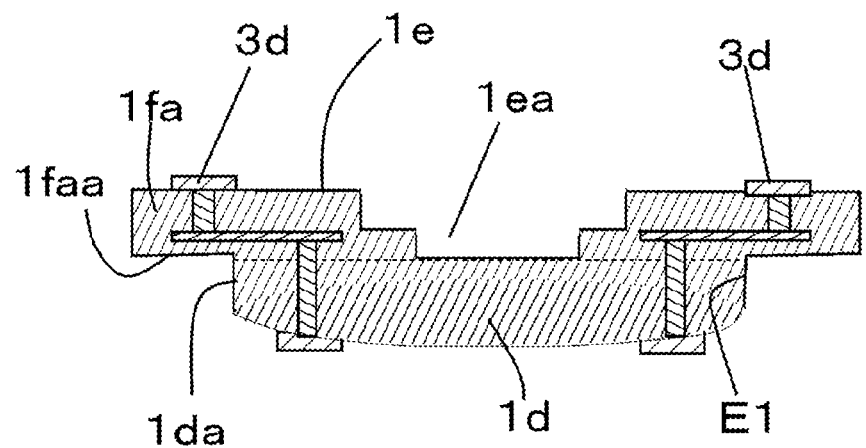
FIG. 13 is a cross-sectional view illustrating another mode of the wiring board according to the embodiments.
Figure 14:
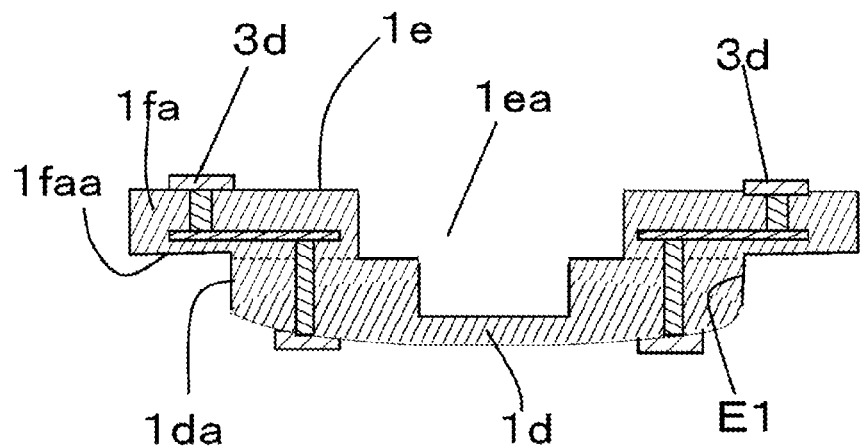
FIG. 14 is a cross-sectional view illustrating another mode of the wiring board according to the embodiments.
Figure 15:
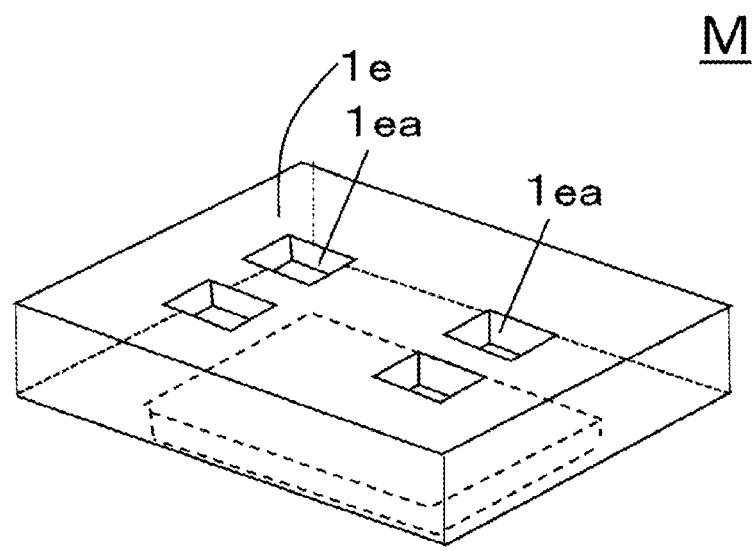
FIG. 15 is a cross-sectional view illustrating another mode of the wiring board according to the embodiments.

FIG. 7 is a perspective view illustrating one mode of an electric device according to the embodiments of the present disclosure. FIG. 8 is a cross-sectional view taken along a line viii-viii illustrated in FIG. 7. FIG. 9 is a perspective view illustrating another mode of the electric device according to the embodiments of the present disclosure. FIG. 10 is a cross-sectional view taken along a line x-x illustrated in FIG. 9. A different point of the electric device illustrated in FIG. 9 from the electric device illustrated in FIG. 7 is that the electric device illustrated in FIG. 9 does not include the frame member E.

Each of an electric device F and an electric device H includes an electric element G on the right face 1e of the corresponding wiring board C. The electric element G is connected to the element connection terminals 3d arranged on the wiring board C. In this case, there is illustrated a flip chip method; however, a method for connecting the electric element G to the wiring board C is not limited thereto, and a wire bonding method may be employed depending on usage or size of the electric element G.

The wiring board C is preferable in terms of heat dissipation and connection reliability to the external circuit board B as a multichip wiring board on which the electric element G is mounted whose size is larger as the size of the electric element G is closer to a size of the base 1f, or on which the plurality of electric elements G is mounted even though its size is small.

When the wiring board C has a structure including the inner wires 3b and the via electric conductors 3c, it is possible to obtain the wiring board C and the electric devices F and H in which inductance of the electric conductors 3 is small, in addition to realizing their miniaturization and height reduction. As the electric element G, an integrated circuit such as a large-scale integration (LSI) or a light emitting element such as a LASER diode may be preferably employed.

Next, other modes of the wiring board according to the embodiments are illustrated in FIGS. 11 to 18. Among them, in wiring boards M and N illustrated in FIGS. 15 to 18, the electric conductors 3 such as the external connection terminals 3a, the inner wires 3b, the via electric conductors 3c, and the element connection terminals 3d are omitted; however, in this case, there is included, as needed basis, at least one of the electric conductor 3, which is selected from a group of the external connection terminal 3a, the inner wire 3b, the via electric conductor 3c, the element connection terminal 3d, and the like.

Each of wiring boards I to N illustrated in FIGS. 11 to 18 includes at least one of a concave part 1ea and a convex part 1eb on the right face 1e on which the element connection terminals 3d are arranged. A shape of the concave part 1ea is obtained by hollowing the right face 1e in a depth direction. The convex part 1eb has a shape of a base, which is formed on the right face 1e. The concave part 1ea and the convex part 1eb are arranged at positions that is preferable for mounting a functional component and a passive component. In this case, the concave part 1ea is preferable for mounting thereon a passive component. On the other hand, the convex part 1eb is preferable for mounting thereon a functional component. The concave part 1ea may be formed by hollowing a part of the protruding part 1d in its depth direction so as to reach a deep position. Among the plurality of concave parts 1ea, at least one of area and depth may be different. An area of the concave part 1ea means an area on the right face 1e. The depth means a length from the right face 1e to a bottom leas of the concave part 1ea. With respect to the convex part 1eb, when the plurality of convex parts 1eb is arranged on the right face 1e, at least one of area and height may be different. The height means a length from the right face 1e to a top part 1ebt of the convex part 1eb.

As a passive component, a capacitor, a coil, a resistance, a filter, and the like may be exemplified. As a functional component, there may be exemplified a Light Emitting Diode (LED), a Laser Diode (LD), and a Photodiode (PD) in addition to a semiconductor element such as an Integrated Circuit (IC), a Large Scale Integrated Circuit (LSI), and a Metal Oxide Semiconductor Field Effect Transistor (MOSFET).

The number of passive components mounted on the wiring boards I to N is larger than that of functional components mounted thereon. In such a case, in a state where a lot of passive component are mounted on the wiring boards I to N, for example, when height is different between the passive components, thickness of the mounting structure A as a whole is controlled by a passive component whose height is large. As a result, height reduction of the mounting structure A becomes difficult. In such a case, when employing the wiring boards I to N illustrated in FIGS. 11 to 18, passive components are able to be mounted on deep positions from the right face 1e of the wiring boards I to N, so that it is possible to realize height reduction of the mounting structure A. When the wiring boards I to N include a concave part, it is possible to reduce possibility that a passive component or a functional component protrudes from the right face 1e. As a result, ventilation above the right face 1e is improved so as to improve heat dissipation. When a lot of concave parts are formed on the right face 1e of the wiring boards I to N, a surface area of each of the wiring boards I to N is increased. In this case, heat dissipation of the wiring boards I to N is able to be improved. In this case, the plurality of concave parts 1ea provided in the wiring boards I to N may have different height. Thus, it is possible to reduce possibility where a passive component protrudes from the right face 1e, even when size of passive components, such as height, is different.

Figure 16:
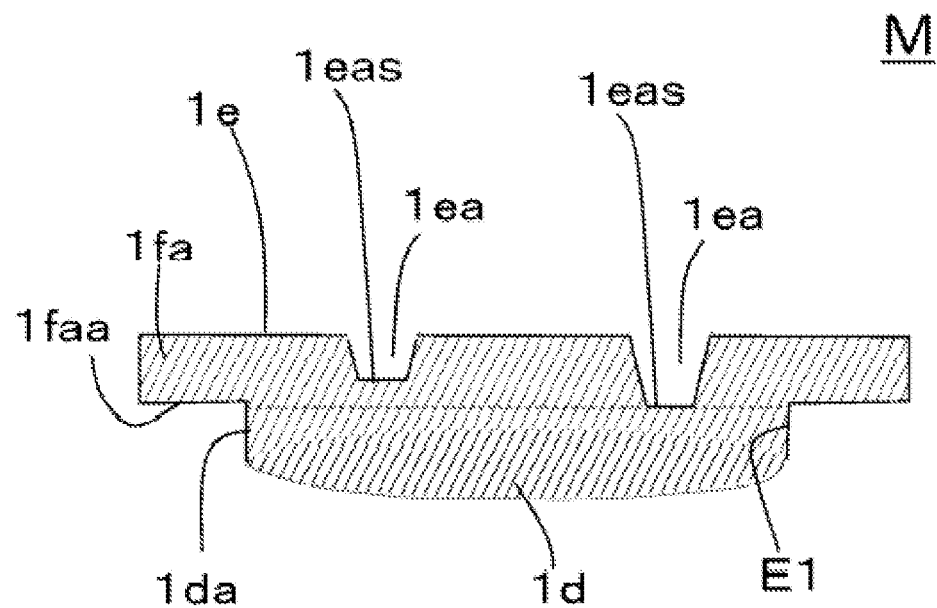
FIG. 16 is a cross-sectional view taken along a line xv-xv illustrated in FIG. 15.
Figure 17:
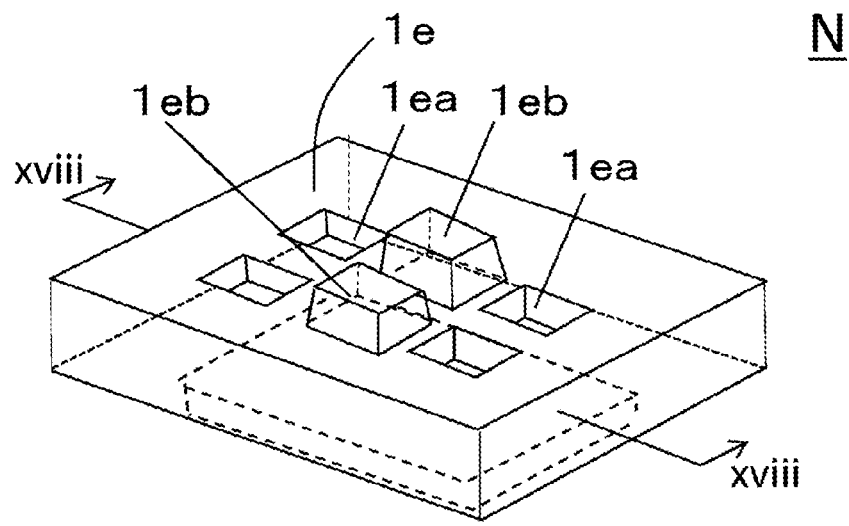
FIG. 17 is a cross-sectional view illustrating another mode of the wiring board according to the embodiments.
Figure 18:
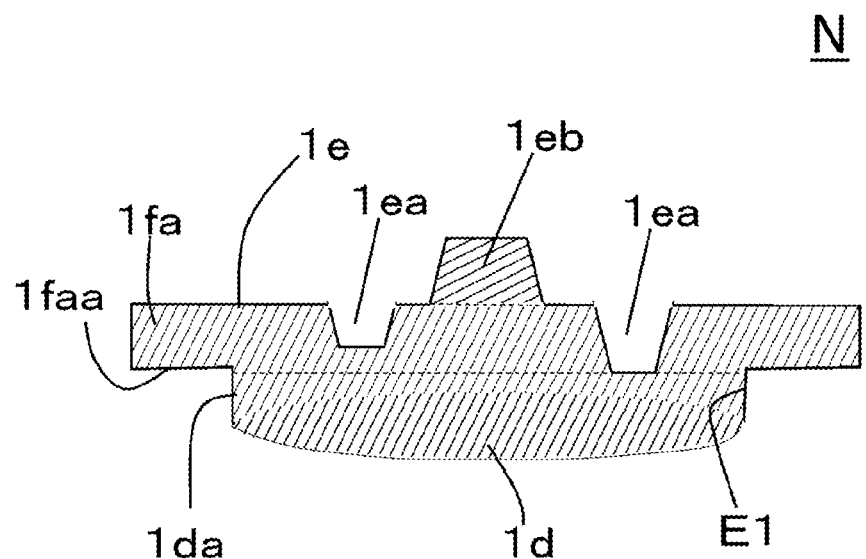
FIG. 18 is a cross-sectional view taken along a line xviii-xviii illustrated in FIG. 17.

As illustrated in FIG. 16, assume a structure in which the element connection terminals 3d electrically connecting passive components are arranged in a part of the bottom leas of the concave part 1ea, or a part close to the bottom leas. A plurality of passive components mounted in the concave parts 1ea in the right face 1e of the wiring boards I to N is connected by the inner wires 3b and the via electric conductors 3c provided in the wiring boards I to N. In such a case, it is possible to shorten portions of wires extending from the inner wires 3b or the via electric conductors 3c to the element connection terminals 3d of the right face 1e. As a result, it is possible to reduce inductance caused by the electric conductors 3 in the wiring boards I to N.

As described above, the wiring boards I to N illustrated in FIGS. 11 to 18 may include the convex part 1eb on the right face 1e. In this case, the plurality of convex parts 1eb may be formed on the right face 1e. When the plurality of convex parts 1eb is formed on the right face 1e, heights of the convex parts 1eb may be different form each other. In this case, it is possible to reduce possibility that a functional component excessively protrudes from the right face 1e even when sizes of functional components such as height are different from each other.

Heights of the convex parts 1eb are preferably different from each other in terms of the following point. Commonly, a functional component consumes more electric power than a passive component. When being driven, a functional component generates heat more easily than a passive component. In such a case, there is required a plan for intendedly dissipating heat from the wiring boards I to N. When heights of the convex parts 1eb are different from each other in a state where the plurality of convex parts 1eb is formed on the right face 1e, it is possible to disperse positions of functional components from the right face 1e in the height direction. Thus, positions in the height direction of heat generating sources constituted of functional components are able to be dispersed. A functional component itself has a characteristic temperature dependence in some cases. In such a case where a plurality of functional components is mounted on the right face 1e of the wiring boards I to N, effect of heat received by one of the functional components from the other functional components is able to be reduced.

Figure 19:
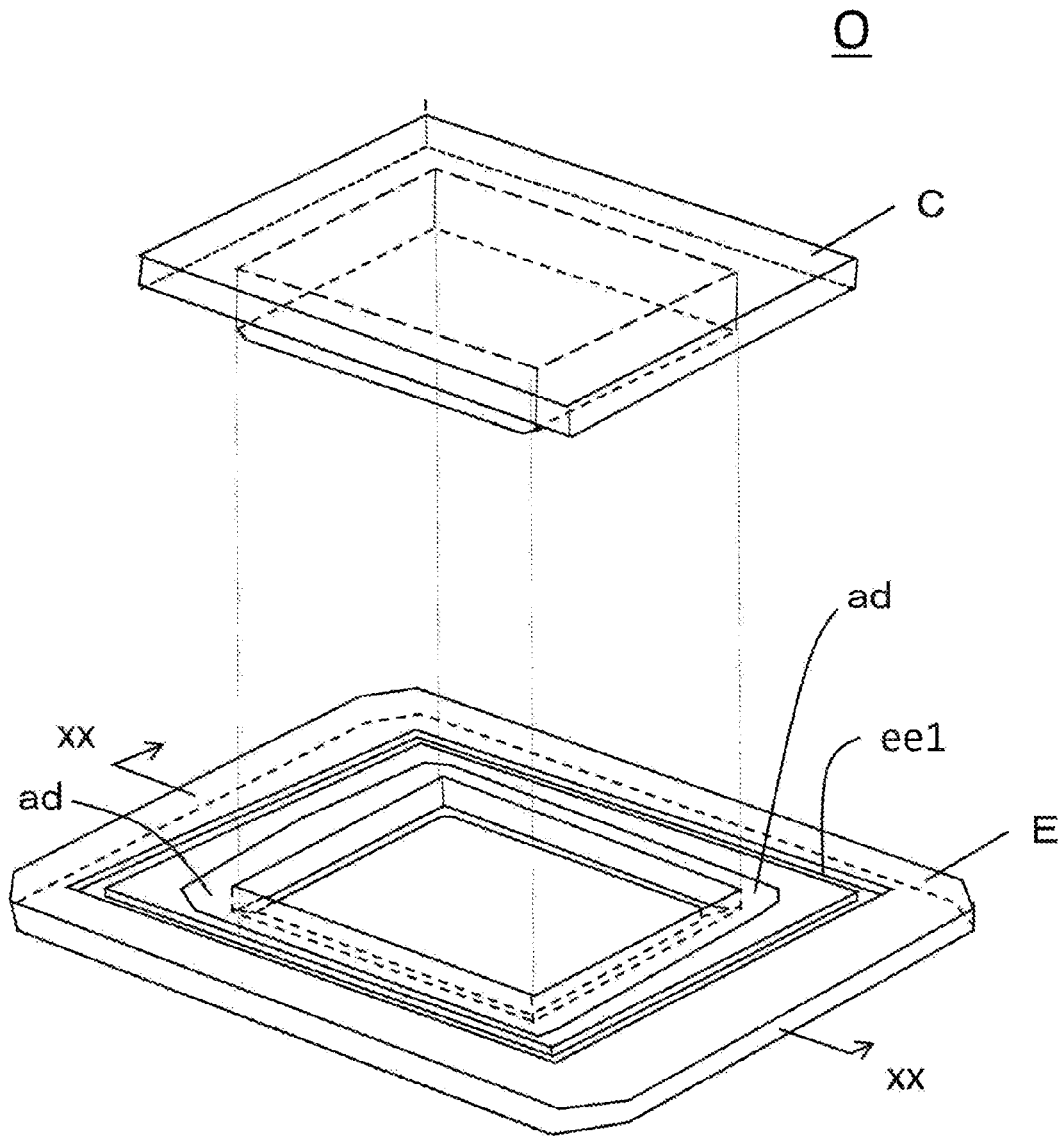
FIG. 19 is an exploded perspective view illustrating another mode of the composite substrate according to the embodiments.
Figure 20:
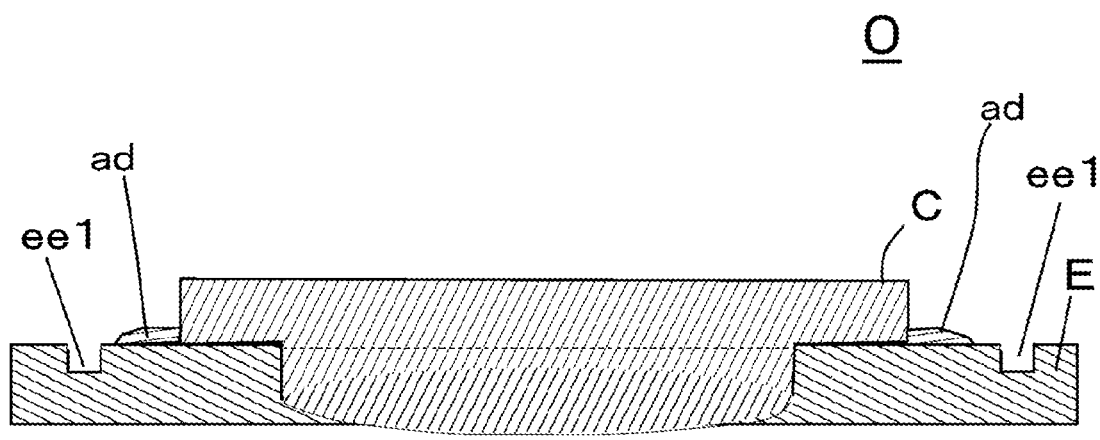
FIG. 20 is a cross-sectional view taken along a line xx-xx illustrated in FIG. 19.

FIGS. 19 and 20 illustrate another mode of the composite substrate according to the embodiments. A composite substrate O illustrated in FIGS. 19 and 20 includes a groove ee1 on a surface of the frame member E. In FIG. 19, the composite substrate O is in a state where the wiring board C and the frame member E are separated from each other in an up-and-down direction, this is for convenience of explanation of a shape and arrangement of the groove ee1 formed on a surface of the frame member E. As illustrated in FIG. 19, it is preferable that the groove ee1 is formed to surround a periphery of the opening E1 that is provided in the frame member E.

Figure 21:
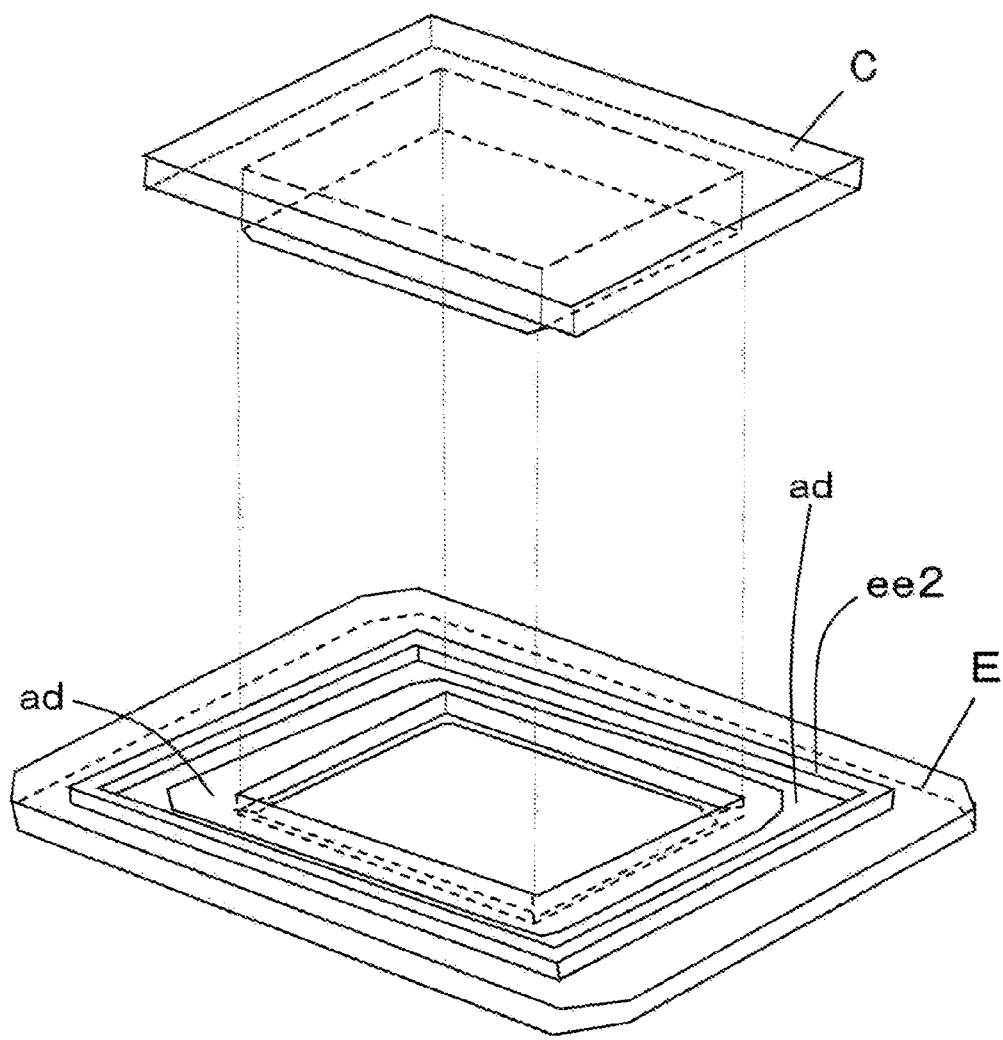
FIG. 21 is an exploded perspective view illustrating another mode of the composite substrate according to the embodiments.
Figure 22:
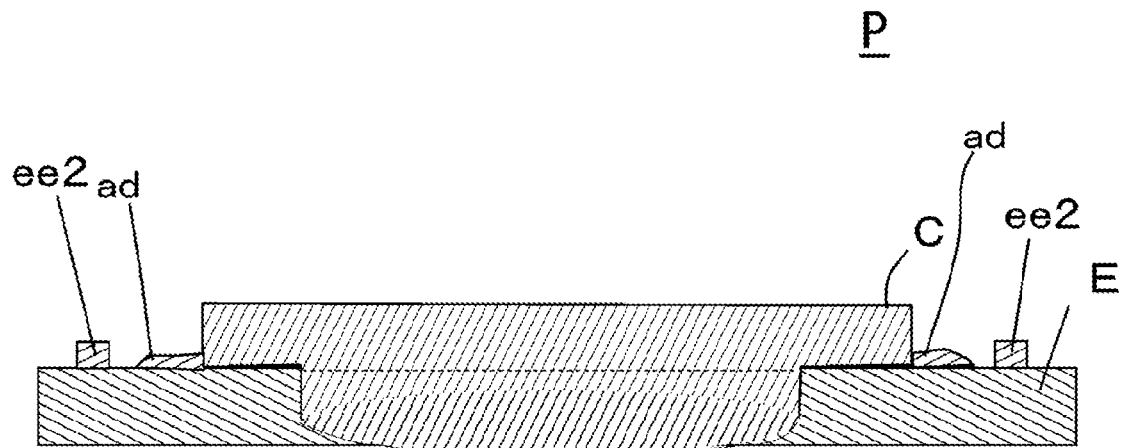
FIG. 22 is a cross-sectional view taken along a line xxii-xxii illustrated in FIG. 21.

FIGS. 21 and 22 illustrate another mode of the composite substrate according to the embodiments. A composite substrate P illustrated in FIGS. 21 and 22 includes a wall part ee2 on a surface of the frame member E. In FIG. 21, the composite substrate P is also in a state where the wiring board C and the frame member E are separated from each other in an up-and-down direction, this is also for convenience of explanation of a shape and arrangement of the wall part ee2 formed on a surface of the frame member E. As illustrated in FIG. 21, it is preferable that the wall part ee2 is formed to also surround a periphery of the opening E1 that is provided in the frame member E.

According to the composite substrate O and the composite substrate P, when the wiring board C is bonded to the frame member E by using bonding material ad, it is possible to prevent the bonding material ad applied to an inner wall of the opening E1 from spreading on a surface of the frame member E. In a case of the composite substrate O, the bonding material ad accumulates in the groove ee1. In a case of the composite substrate P, the bonding material ad is dammed up by an inner surface of the wall part ee2 on a side of the opening E1 to accumulate on a surface of the frame member E between the opening E1 and the wall part ee2.

Figure 23:
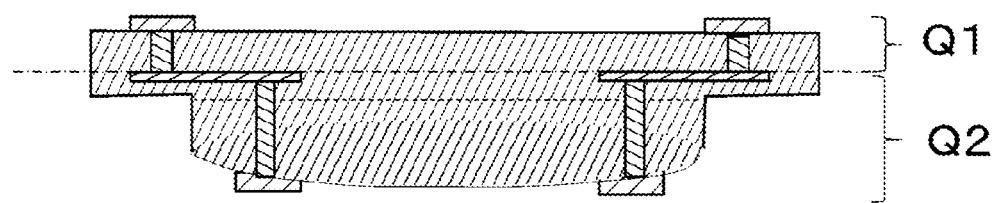
FIG. 23 is a schematic cross-sectional view illustrating a laminated molded body that is used in manufacturing the wiring board according to the embodiments of the present disclosure.
Figure 24:
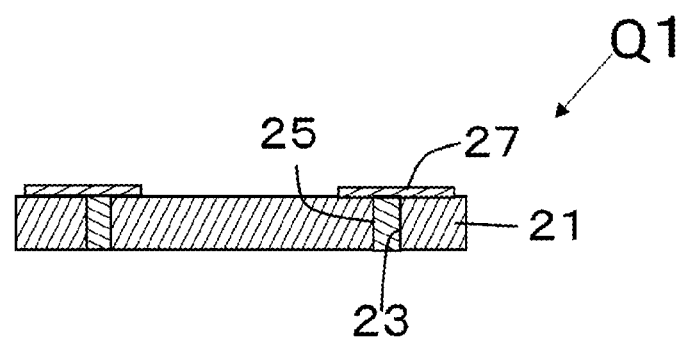
FIG. 24 is a schematic cross-sectional view illustrating a base molded body that is a part of the laminated molded body illustrated in FIG. 23.
Figure 25:
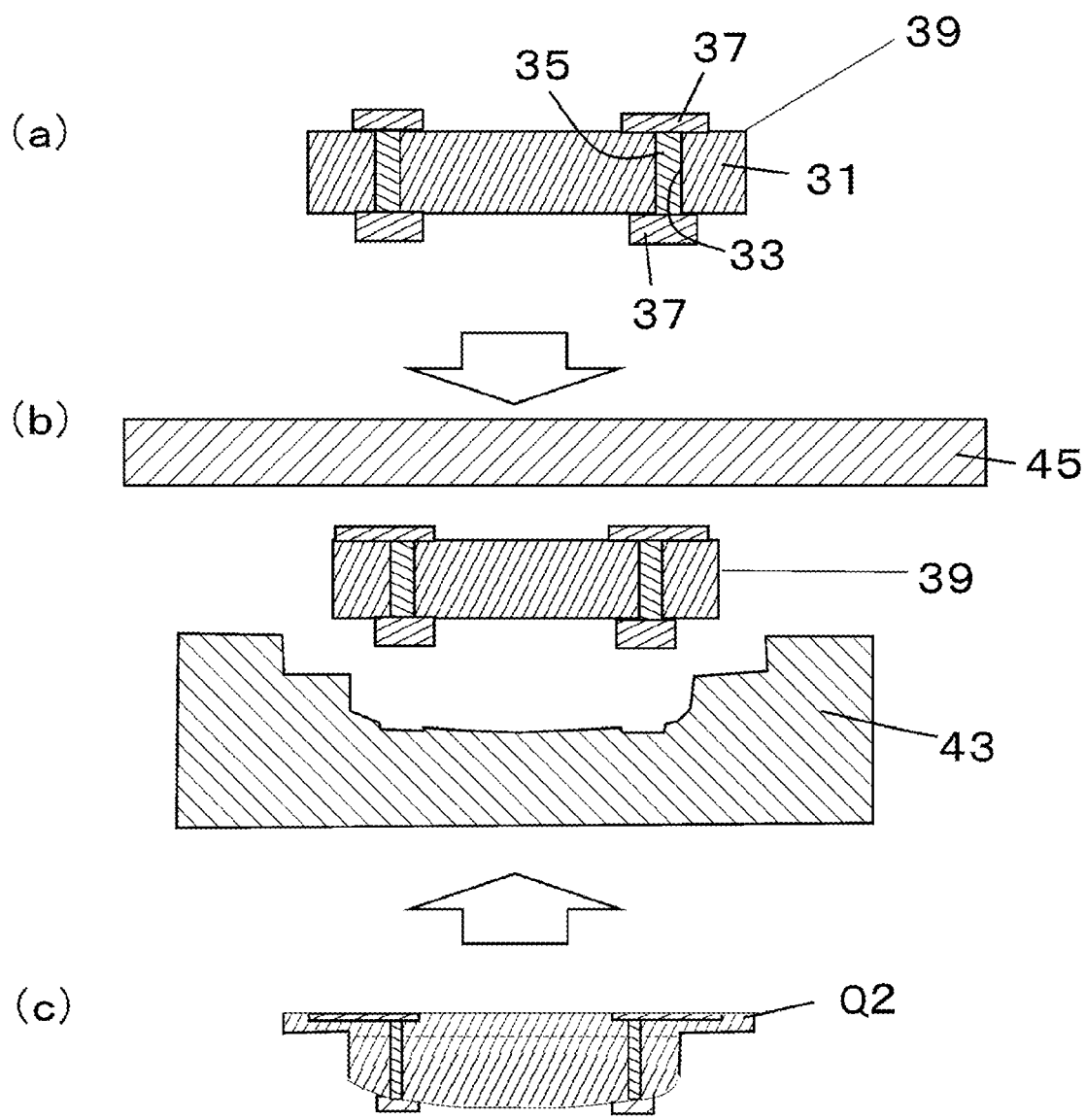
FIG. 25 is a schematic cross-sectional view illustrating a manufacturing method of a convex molded body that is a part of the laminated molded body illustrated in FIG. 23.
Figure 26:
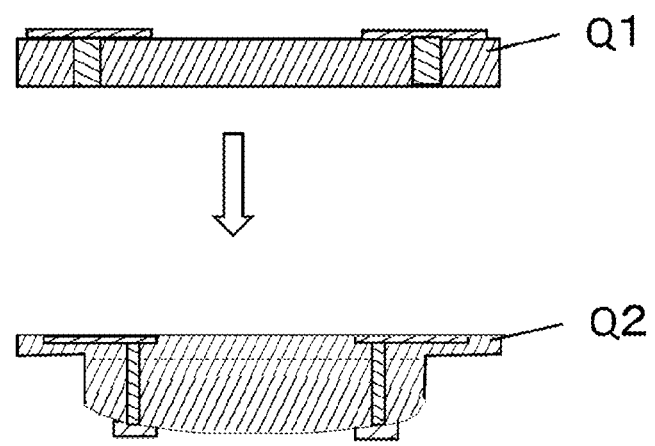
FIG. 26 is a schematic cross-sectional view illustrating a state in which the base molded body is laminated on the convex molded body.

Next, a manufacturing method of the wiring board, the composite substrate, and the electric device will be explained. FIG. 23 is a schematic cross-sectional view illustrating a laminated molded body that is used in manufacturing the wiring board according to the embodiments of the present disclosure. FIG. 24 is a schematic cross-sectional view illustrating a base molded body that is a part of the laminated molded body illustrated in FIG. 23. FIG. 25 is a schematic cross-sectional view illustrating a manufacturing method of a convex molded body that is a part of the laminated molded body illustrated in FIG. 23. FIG. 26 is a schematic cross-sectional view illustrating a state in which the base molded body is laminated on the convex molded body. A schematic cross-sectional view illustrating a laminated molded body 21 to be the wiring board C later.

As illustrated in FIG. 23, a base molded body Q1 is laminated on a convex molded body Q2 to fabricate a laminated molded body I. With reference to FIG. 24, a method for fabricating the base molded body Q1 will be explained. First, a green sheet 21 is prepared, and through holes 23 are formed in the green sheet 21 to fabricate the base molded body Q1. Next, the through holes 23 formed in the green sheet 21 are filled with electric conductive paste so as to form via fillers 25 to be via electric conductors. Next, an electric conductive pattern 27 is formed on a surface of the green sheet so as to cover surfaces of the via fillers 25. In this way, the base molded body Q1 is able to be obtained.

Next, with reference to FIG. 25, a method for fabricating the convex molded body Q2 will be explained. In a process (a), first, a green sheet 31 is prepared, and then through holes 33 are formed in the green sheet 31. Next, the through holes 33 formed in the green sheet 31 are filled with electric conductive paste so as to form via fillers 35. Next, an electric conductive pattern 37 is formed on a surface of the green sheet 31 so as to cover surfaces of the via fillers 25. In this way, a pattern sheet 39 is obtained.

Next, in a process (b), pressured molding is performed on the fabricated pattern sheet 39 by using a mold obtained by combining a concave mold 43 and a flat mold 45 as illustrated in (b). In this way, the convex molded body Q2 is able to be formed. In this case, in the fired wiring board C, when a shape of the concave mold 43 is adjusted, it is possible to fabricate any of a shape of the first surface 1*da* of the protruding part 1*d* in which the inside 1*c* protrudes from the outer periphery 1*b*, a shape in which a foot of the side surface 1*dd* of the protruding part 1*d* is concavely curved from the surface 1*faa* of the base periphery portion 1*fa*, and a shape in which the side surfaces 3*as* of the external connection terminals 3*a* that are formed on the first surface 1*da* of the protruding part 1*d* constituting the base material 1 are convex. Herein, as a mold 41, the mold 41 illustrated in FIG. 25 (*b*) is employed; however, the above-mentioned mold 41 obtained by combining the concave mold 43 and the flat mold 45 is merely one example, and thus a partitioned die obtained by diving the concave mold 43 in its width direction into two equal parts may be used, for example.

Next, as illustrated in FIG. 26, the base molded body Q1 is laminated on the convex molded body Q2 so as to obtain a laminated molded body Q illustrated in FIG. 23. Next, the fabricated laminated molded body Q is fired (maximum temperature: 1500° C. to 1900° C.) so as to obtain the wiring board C.

In the wiring board C obtained in this way, the base material 1 includes, on its one side, the protruding part 1*d* that protrudes toward the outside. The inside 1*c* of the first surface 1*da* in protruding part 1*d* has a shape of protruding from the outer periphery 1*b*.

Next, the metallic frame member E is prepared. The frame member E includes the opening E1 that corresponds to a shape of the protruding part 1*d* constituting the base material 1 of the wiring board C. The base material 1 is attached thereto such that the opening E1 of the frame member E is fitted to the protruding part 1*d* constituting the wiring board C. The frame member E and the base material 1 may be bonded to each other by caulking; however, there may be employed a method for applying solder or silver solder to a contact portion between the frame member E and the base material 1.

The electric device F or the electric device H may be obtained by mounting the electric element G on the right face 1*e* of the wiring board C constituting the electric device F and the electric device H. In this case, the element connection terminals 3*d* arranged on the right face 1*e* of the wiring board C and terminals of the electric element G are connected to each other. In this way, it is possible to obtain the electric device F or the electric device H that includes the electric element G on the right face 1*e* of the base material 1.

As a laminated molded body for fabricating the wiring boards I to N illustrated in FIGS. 11 to 18, for example, there may be employed a body whose surface portion of the base molded body Q1 is concavely and convexly formed by using a die, instead of the base molded body Q1 illustrated in FIG. 24. With respect to the frame member E illustrated in FIGS. 18 to 22, it is sufficient that a metallic member preliminary-processed into a predetermined shape (with groove ee1 or wall part ee2) may be used as the frame member E.

Practical Example

A wiring board was fabricated by the method illustrated in FIGS. 24, 25, and 26. First, as mixed powder for forming a green sheet, a mixed powder was prepared by mixing powders at a ratio of 5% by mass of yttria powder and 1% by mass of calcia powder with respect to 94% by mass of an aluminum nitride powder. Next, 20 parts by mass of an acrylic binder as an organic binder and 50 parts by mass of toluene were added to 100 parts by mass of the above-mentioned mixed powder (solid content) so as to prepare a slurry, and then a green sheet having a predetermined thickness was fabricated by the doctor blade method. For electric conductive paste for forming electric conductors, a paste was employed which is obtained by appropriately adding an acrylic organic binder and terpineol to a mixed powder obtained by mixing a tungsten powder and an aluminum nitride powder at a ratio of 7:3 so as to prepare an electric conductive paste. The fabricated laminated molded body was fired at two times in a reduction atmosphere and at a condition whose maximum temperature is 1800° C., so as to obtain a wiring board.

A fired shape of the fabricated wiring board was 3.5 mm in width×4 mm in length. Thickness of the wiring board was 0.6 mm at its base and 0.4 mm at its protruding part. The width and the length of the protruding part were set to 0.8 times larger than those of the base. External connection terminals were arranged 0.5 mm inside from an edge of a first surface of the protruding part. The external connection terminals were evenly arranged along a longitudinal direction of the first surface of the protruding part. The first surface of the protruding part was convexly curved. The maximum value of a thickness of the curved portion of each sample was 0.08 mm. The thickness of the curved portion was a thickness when the wiring board was viewed in a cross-sectional view. A size of the external connection terminal was 0.2 mm in depth×0.2 mm in width, and was square-shaped. A pitch between the external connection terminals was 0.3 mm. The maximum thickness of the external connection terminal was 0.05 mm. An element connection terminal formed on a right face of the wiring board was square of 0.3 mm in depth×0.3 mm in width. A pitch between the element connection terminals was 0.5 mm. As an electric element, a semiconductor element was employed whose power consumption was 80 W. A size of the semiconductor element was 3 mm in length, 2.5 mm in width, and 0.6 mm in thickness. In the semiconductor element, terminals were provided at ten positions on its one surface. The five terminals were aligned at each of both ends of the semiconductor element along its length direction in parallel. FR-4 whose thickness was 2 mm was employed for an external circuit board. The external circuit board was square of 10 mm in depth×10 mm in width. The external circuit board included a connecting pad corresponding to arrangement of external connection terminals of the wiring board. The maximum thickness of the connecting pad was 0.05 mm. A copper foil was attached to a surface of the external circuit board, which was corresponding to the protruding part of the wiring board, in order to improve heat dissipation, and penetrating viae were provided in an inner portion of the external circuit board under the copper foil.

External connection terminals of the wiring board were connected with a connecting pad of the external circuit board by using solder. A thickness of the solder was adjusted to be 0.01 mm. In Table 1, there are indicated a shape of a first surface of the protruding part, a shape of a deep-eaves portion of the protruding part, a shape of the external connection terminal, and an interval between the first surface of the protruding part and the surface of the external circuit board. The interval between a first surface of the protruding part and a surface of the external circuit board indicated in Table 1 is the lowest value. A digital microscope was used for measuring a size of the wiring board, a shape of the protruding part, a shape of a cross section of the external connection terminal formed on the first surface of the protruding part, an interval between the first surface of the protruding part and a surface of the external circuit board, a size and a pitch of element connection terminals formed on a right face of the wiring board, a size of the semiconductor element, a size and a thickness of the external circuit board, and an interval between the first surface of the protruding part constituting the wiring board and a surface of the external circuit board.

In Table 1, that a shape of the deep-eaves portion is "concave" means a state where a portion connected with a surface of the base periphery portion and a side surface of the protruding part is thick and concavely curved. That a shape of the deep-eaves portion is "right angle" means that a shape of a portion connected with a surface of the base periphery portion and a side surface of the protruding part is not concave and has an angle of 90° or approximately 90°. In any of the samples, in an external connection terminal formed in the wiring board, a thickness on a side of an outer periphery of the base material was larger than a thickness of a side of an inner portion. In order to evaluate heat dissipation of a wiring board, a thermocouple was arranged on a side surface of a base material of the wiring board, and a temperature of the wiring board was measured. With respect to a temperature of the wiring board, a temperature T1 just after stopping driving a semiconductor element and a temperature T2 five seconds after stop of driving were measured to obtain a ratio of T2/T1. The number of samples was set to five, and average values were indicated in Table 1. Connection reliability between external connection terminals and a connecting pad was assessed by a heat cycle test. A condition of the heat cycle test was that the maximum temperature was 125° C., the minimum temperature was −55° C., a sample was left for one minute at each of the maximum temperature and the minimum temperature, and then a temperature was changed over one minute. The number of samples was 100. In a wiring board fabricated as a comparison example (Sample No. 1), an interval between a first surface of the protruding part and a surface of the external circuit board was larger by approximately 0.07 mm because a first surface of the protruding part was not curved.

As obvious from the result illustrated in Table 1, in Samples (samples No. 2 to No. 5) whose first surface of the protruding part was convexly-curve-shaped, a ratio of T2/T1 was equal to or less than 0.6, on the other hand, in Sample No. 1 whose first surface of the protruding part was flat-shaped, a ratio of T2/T1 was 0.8. The number of defects in the heat cycle test was smaller and connection reliability was higher in each of Samples (sample No. 3 to No. 5) whose portion connected with a base periphery portion and a protruding part was concavely-shaped, compared with the sample (Sample No. 2) whose portion connected with a base periphery portion and a protruding part had a right angle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A composite substrate including a wiring board comprising:
   a base material including a protruding part that protrudes from one side of the base material toward an outside, wherein
   the protruding part has a shape in which a center portion of a principal surface rises from an outer periphery,
   a plurality of external connection terminals is arranged on the principal surface, and
   a metallic frame member, wherein
   in a plan view of the base material, the metallic frame member includes an opening whose shape is corresponding to the shape of the protruding part,
   and the metallic frame member is arranged such that the opening surrounds the protruding part to fill a periphery of the protruding part.

2. The composite substrate according to claim 1, wherein a side surface of the plurality of external connection terminals is convexly or concavely curved.

TABLE 1

| Sample No. | Protruding Part | | Shape of Cross Section of External Connection Terminal | Interval Between First Surface of Protruding Part and Surface of External Circuit Board mm | Heat Dissipation (T2/T1) | Connection Reliability (Number of Defects) n/100 |
|---|---|---|---|---|---|---|
| | Shape of First Surface | Shape of Deep-Eaves Portion | | | | |
| 1 | Flat | Right Angle | Flat | 0.11 | 0.8 | 6 |
| 2 | Convexly Curved | Right Angle | Flat | 0.04 | 0.6 | 3 |
| 3 | Convexly Curved | Concave | Flat | 0.04 | 0.6 | 2 |
| 4 | Convexly Curved | Concave | Flat | 0.04 | 0.6 | 2 |
| 5 | Convexly Curved | Concave | Convex | 0.04 | 0.5 | 1 |

3. The composite substrate according to claim 1, wherein a thickness on a side of the outer periphery of the plurality of external connection terminals is larger than a thickness of an inner portion.

4. The composite substrate according to claim 1, wherein when a part of the base material other than the protruding part is a base and an outer side portion of the protruding part is a base periphery portion, a portion connected with a surface of the base periphery portion and a side surface of the protruding part is concavely curved.

5. The composite substrate according to claim 1, wherein the base material includes, on the right face, at least one of a concave part and a convex part.

6. The composite substrate according to claim 1, wherein a surface of the metallic frame member and the principal surface are flush with each other.

7. The composite substrate according to claim 1, wherein the metallic frame member includes, in a periphery of the opening, one of a groove and a wall part that surrounds the periphery.

8. An electric device comprising:
an electric element on a right face of the composite substrate including the wiring board according to claim 1.

9. An electric device comprising:
an electric element on a right face of the composite substrate including the wiring board constituting the composite substrate according to claim 1.

10. The composite substrate including the wiring board according to claim 1 further comprising:
when a second principal surface opposite to the principal surface of the base material is a right face, the right face having a plurality of element connection terminals, wherein
each planar dimension of the plurality of external connection terminals is smaller than each respective planar dimension of the plurality of element connection terminals.

\* \* \* \* \*